United States Patent
Kim

(10) Patent No.: US 8,999,537 B2
(45) Date of Patent: Apr. 7, 2015

(54) BATTERY PACK

(75) Inventor: Eunyoung Kim, Yongin-si (KR)

(73) Assignee: Samsung SDI Co., Ltd., Gyeonggi-Do (KR)

(*) Notice: Subject to any disclaimer, the term of this patent is extended or adjusted under 35 U.S.C. 154(b) by 251 days.

(21) Appl. No.: 13/326,169

(22) Filed: Dec. 14, 2011

(65) Prior Publication Data

US 2012/0231303 A1    Sep. 13, 2012

(30) Foreign Application Priority Data

Mar. 7, 2011  (KR) .................. 10-2011-0019956

(51) Int. Cl.
| H01M 14/00 | (2006.01) |
| H05K 1/11 | (2006.01) |
| H01M 10/42 | (2006.01) |
| H01M 2/10 | (2006.01) |
| H05K 3/34 | (2006.01) |
| H05K 3/30 | (2006.01) |

(52) U.S. Cl.
CPC .......... *H01M 10/425* (2013.01); *H01M 2/1066* (2013.01); *H05K 3/306* (2013.01); *H05K 3/3447* (2013.01); H05K 2201/09827 (2013.01); H05K 2201/09854 (2013.01); H05K 2201/10037 (2013.01)

(58) Field of Classification Search
None
See application file for complete search history.

(56) References Cited

U.S. PATENT DOCUMENTS

2004/0137803 A1* 7/2004 Pitzele .......................... 439/884
2009/0246615 A1  10/2009 Park

FOREIGN PATENT DOCUMENTS

| JP | 2009-064919 A | | 3/2009 | |
| KR | 10-2007-0033834 A | | 3/2007 | |
| KR | 10-2005-0130891 | * | 7/2007 | ............. H01M 2/34 |
| KR | 10-2007-0068847 A | | 7/2007 | |
| KR | 10-0778987 B1 | | 11/2007 | |
| KR | 20-2009-0002111 U | | 3/2009 | |
| KR | 10-2009-0104584 A | | 10/2009 | |
| KR | 20-2007-001483 | * | 10/2009 | ............. H05K 1/02 |

OTHER PUBLICATIONS

Conformal Coatings, Dow Corning available online Jun. 2009 at www.dowcorning.com/content/etronics/etronicscoat/etronics_cc_tutorial.asp.*
English translation of KR 10-2005-0130891.*
English translation of Jeong-Gil (KR 20-2007-001483).*
Korean Notice of Allowance dated Mar. 22, 2013 for Korean Patent Application No. KR 10-2011-0019956 which corresponds to captioned U.S. Appl. No. 13/326,169.
Korean Office Action dated Sep. 4, 2012 for Korean Patent Application No. KR 10-2011-0019956 which corresponds to captioned U.S. Appl. No. 13/326,169.

* cited by examiner

Primary Examiner — Yoshitoshi Takeuchi
(74) Attorney, Agent, or Firm — Knobbe Martens Olson & Bear LLP

(57) ABSTRACT

A battery pack configured to prevent excess solder material from flowing down onto a protective circuit module (PCM) is disclosed. According to some aspects, the battery pack includes at least one battery cell, a protective circuit module (PCM) electrically connected to the battery cell, and a conductive tab configured to electrically connect the battery cell to the PCM. A tapered through hole is formed in the PCM so that the conductive tab is inserted into and fixed to the through hole.

10 Claims, 3 Drawing Sheets

BATTERY PACK

CROSS-REFERENCE TO RELATED PATENT APPLICATION

This application claims the benefit of Korean Patent Application No. 10-2011-0019956 filed on Mar. 7, 2011, in the Korean Intellectual Property Office, and entitled: "BATTERY PACK" the disclosure of which is incorporated herein in its entirety by reference.

BACKGROUND

1. Field

The disclosed technology relates to a battery pack.

2. Description of the Related Technology

In a battery pack including a number of lithium ion secondary batteries. The batteries are generally used in conjunction with a protective circuit. The protective circuit is configured to maintain a uniform charging state or prevent overcharge and overdischarge by controlling the rate of charge and discharge of each battery based on the battery's charge level. The protective circuit may be disposed on a protective circuit module (PCM) and electrically connected to battery cells through conductive tabs formed of a material such as nickel.

According to such a configuration, since a hole wider than the thickness of a conductive tab is formed in a PCM, the conductive tab can be easily inserted into and soldered to the PCM. However, when the conductive tab is inserted into the hole and is soldered to the PCM, excess solder material, such as lead, may flow down onto the PCM and interfere with the proper functionality of the PCM since the width of the hole is greater than the thickness of the conductive tab.

SUMMARY OF CERTAIN INVENTIVE ASPECTS

According to one aspect, a battery pack is disclosed. The battery pack includes at least one battery cell, a protective circuit module (PCM) electrically connected to the at least one battery cell, and a conductive tab configured to electrically connect the at least one battery cell to the PCM. A tapered through hole is formed in the PCM such that the conductive tab is inserted into and fixed to the tapered through hole.

According to another aspect, a protective circuit module (PCM) is disclosed. The PCM includes a first surface, a conductive pattern formed on the first surface, and a tapered through hole formed in the first surface. The tapered through hole is configured to receive a conductive tab and to electrically connect at least one battery cell to the PCM.

BRIEF DESCRIPTION OF THE DRAWINGS

The accompanying drawings are included to provide a further understanding of the present disclosure, and are incorporated in and constitute a part of this specification. The drawings illustrate various embodiments of the present disclosure and, together with the description, serve to explain principles of the present disclosure. In the drawings.

DETAILED DESCRIPTION OF CERTAIN INVENTIVE EMBODIMENTS

Example embodiments will now be described more fully with reference to the accompanying drawings. However, the disclosed embodiments may be embodied in different forms and should not be construed as limited to the embodiments set forth herein. Rather, these embodiments are provided so that this disclosure will be thorough and complete, and will fully convey the scope of the disclosure to those skilled in the art.

Hereinafter, a battery pack according to some embodiments will be described in detail with reference to the accompanying drawings.

Figure 1:
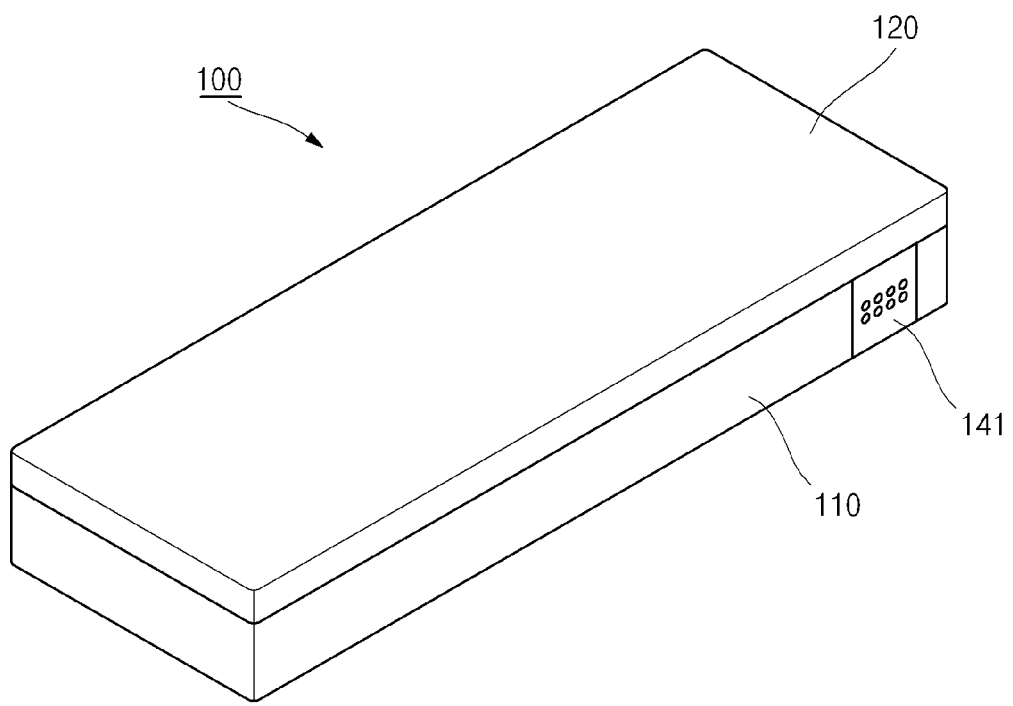
FIG. 1 is a perspective view illustrating a battery pack having first and second cases according to some embodiments.
Figure 2:
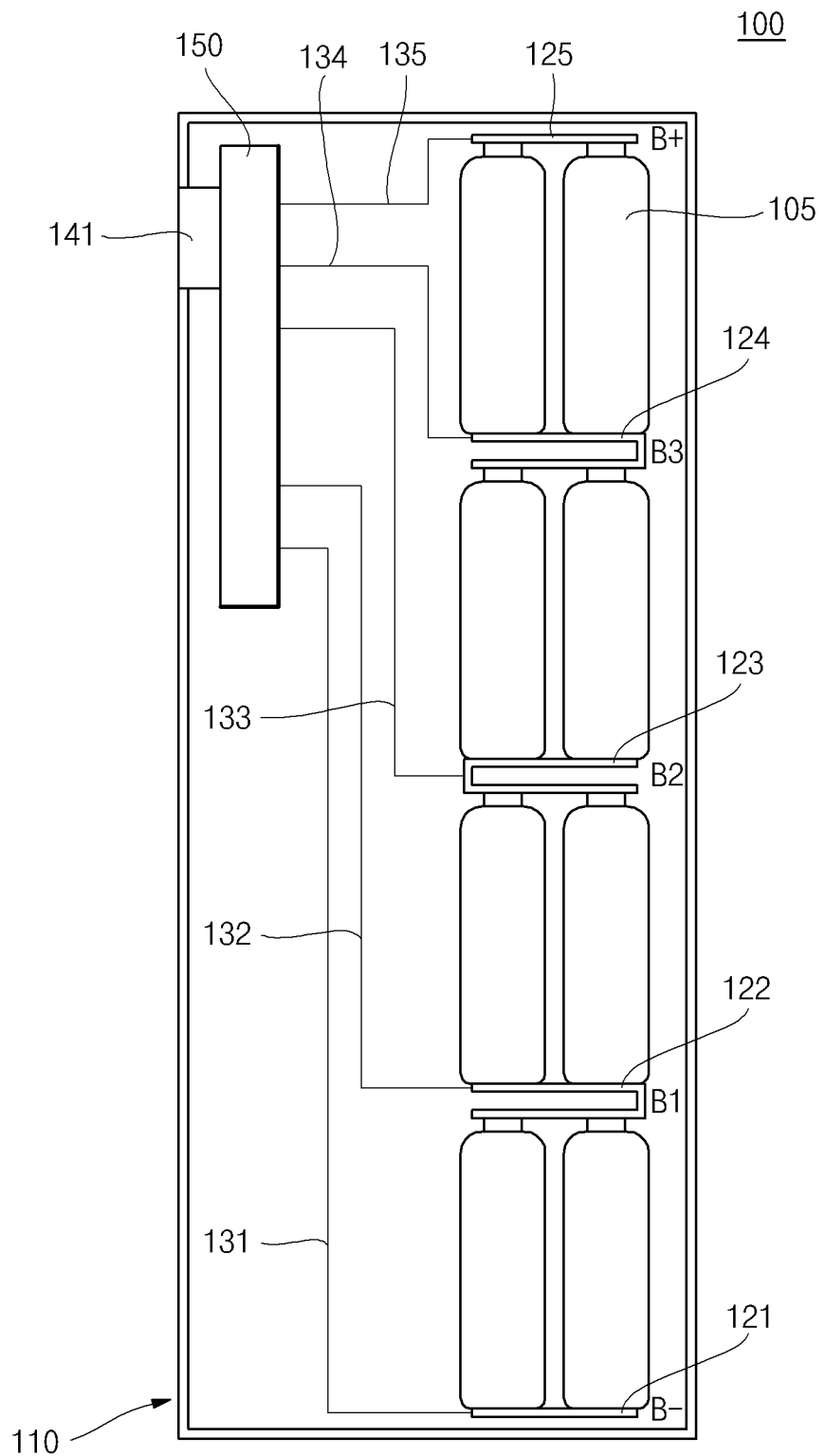
FIG. 2 is a top view illustrating the battery pack of FIG. 1 in a state when the battery pack is not covered by the second-case.

FIG. 1 is a perspective view illustrating a battery pack according to some embodiments. FIG. 2 is a top view illustrating the battery pack of FIG. 1 in a state when the battery pack is not covered by a housing case.

As illustrated in FIG. 1, a battery pack 100 according to some embodiments includes a first case 110, and a second case 120 coupled with the first case 110. In addition, a connecting portion 141 is disposed in a predetermined area of the first case 110 (or the second case 120) to enable connection to an external set or a battery charger.

With reference to FIGS. 1 and 2, the battery pack 100 according to some embodiments includes: a plurality of battery cells 105, and first through fifth conductive plates 121, 122, 123, 124, and 125 configured to connect the plurality of the battery cells 105 in series or in parallel. The battery pack 100 also includes a PCM 150 having a protective circuit disposed therein. First through fifth conductive tabs 131, 132, 133, 134, and 135 of the battery pack 100 are configured to connect the first through fifth conductive plates 121, 122, 123, 124, and 125 to the PCM 150. A connector 141 coupled with a surface of the PCM 150 is included in the battery pack 100. The first and second cases 110 and 120 are configured to house the plurality of the battery cells 105, the first through fifth conductive plates 121, 122, 123, 124, and 125, the PCM 150, the first through fifth conductive tabs 131, 132, 133, 134, and 135, and the connector 141.

A top surface and a bottom surface of each of the plurality of the battery cells 105 correspond to different polarities. In the drawings, it is assumed that the top surface of each battery cell 105 having a protruding terminal shape is a positive electrode, and the bottom surface of each battery cell 105 having a flat shape is a negative electrode. In addition, in the drawings, it is assumed that the top surface of the battery cell 105 is electrically connected to a positive electrode of an electrode assembly in the battery cell 105, and the bottom surface of the battery cell 105 is electrically connected to a negative electrode of the electrode assembly in the battery cell 105. The arrangement of the battery cells 105 is not limited to the above described arrangement. Additionally, although it is assumed in the drawings that the battery pack 100 includes the eight battery cells 105, the number of the battery cells 105 may be variable.

According to some embodiments, B+ and B− are high current terminals, and power supply portions disposed at both ends of the battery cells 105 connected in series and in parallel. The B+ is a positive power supply portion and a highest potential terminal, and the B− is a negative power supply portion and a lowest potential terminal. A conductive tab may be connected to one of the high current terminals to draw out power, as illustrated by the conductive tabs 131 and 135 in FIG. 2. According to some embodiments, a conductive plate may have a tee shape. A horizontal part of the tee shape corresponds to a part welded and fixed to the positive or negative electrode, and a vertical part of the tee shape corresponds to a part where the conductive tab is soldered and fixed.

B1, B2, and B3 correspond to sensing terminals where the battery cells 105 having the different polarities are connected in series. The sensing terminals are middle potential terminals between the highest and lowest potential terminals. The conductive tabs 132 and 134 may be connected to the sensing terminals to sense voltage of the battery cells 105. Here, the conductive plate may have a tee shape before bending. The horizontal part of the tee shape is the part welded and fixed to the positive or negative electrode, and the vertical part of the tee shape is the part where the conductive tab is soldered and fixed.

The first conductive plate 121 may be connected to the lowest potential terminal which corresponds to the negative electrodes of two cells disposed in a lower end portion of the battery cells 105. The second, third, and fourth conductive plates 122, 123, and 124 have bent portions. Sides extending from the bent portions of the second, third, and fourth conductive plates 122, 123, and 124 come into contact with top surfaces of two cells among the battery cells 105 and are fixed. The other sides extending from the bent portions come into contact with bottom surfaces of another two cells having a cylindrical shape among the battery cells 105 and are fixed such that the four cells are connected in series and in parallel. The fifth conductive plate 125 is connected to the highest potential terminal which corresponds to the positive electrodes of two cells disposed in an upper end portion of the battery cells 105. The conductive plate may be formed of a material such as nickel (Ni), copper (Cu), or aluminum (Al), or the like. The number of the conductive plates increases corresponding to an increase in the number of the battery cells 105.

The PCM 150 is electrically connected to the battery cells 105 through the first through fifth conductive tabs 131, 132, 133, 134, and 135 connected to the first through fifth conductive plates 121, 122, 123, 124, and 125. The PCM 150 is connected to an external electronic device through the connector 141 to prevent a battery from being overly discharged or overly charged by using a circuit (not shown) disposed therein. Here, the first through fifth conductive tabs 131, 132, 133, 134, and 135 may be formed of a material such as Ni, Cu, or Al, and may be replaced with coated wires.

The connector 141 includes a body having a hexahedron shape and a plurality of holes (not shown) configured to be electrically connected to or separated from the external electronic device. The connector 141 may include a plurality of conductive leads (not shown) extending by a predetermined length in a rear upward direction inside the holes of the body. The body is formed of a material such as an insulating resin so that the conductive leads do not cause a short circuit.

The first and second cases 110 and 120 are configured to house the battery pack 100. A complete battery pack 100 is formed when the battery pack 100 is housed by the first case 110, and the second case 120 covers the first case 110.

Figure 3:
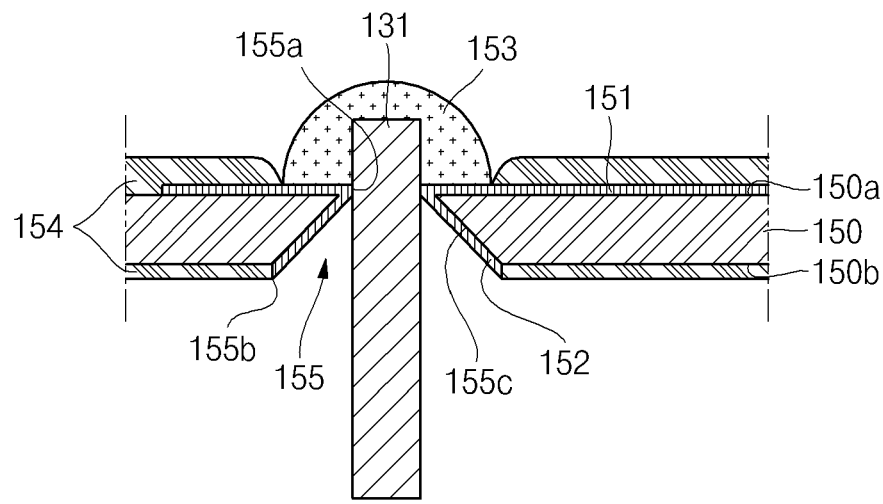
FIG. 3 is a sectional view illustrating a conductive tab of FIG. 1 in a state when the conductive tab is inserted into and soldered to a through hole formed in a PCM.

FIG. 3 is a sectional view illustrating a conductive tab of FIG. 1 in a state when the conductive tab is inserted into and soldered to a through hole formed in a PCM 150.

A conductive pattern 151 formed in an upper portion of a first surface 150a of the PCM 150 is coupled with the PCM 150 in a compressed manner, and is electrically connected to the connector 141. A plating layer 152 is disposed around an inner wall of the through hole 155. The plating layer 152 is configured to allow current to flow through the conductive tab 131. A protective layer 154 is disposed in an upper portion of the conductive pattern 151 and a lower portion of the PCM 150. The protective layer 154 may be formed of an insulating material.

The through hole 155 has a trapezoidal shape. Specifically, the through hole 155 includes a first hole 155a, a second hole 155b, and an inclined surface 155c. The first hole 155a is formed on the first surface 150a. The second hole 155b is formed on a second surface 150b and is wider than the first hole 155a. The inclined surface 155c is disposed between the first hole 155a and the second hole 155b.

The through hole is formed such that the width of the first hole 155a formed on the first surface 150a of the PCM 150 is equal to a thickness of the conductive tab 131. The second hole 155b formed on the second surface 150b is about two to about three times as wide as the first hole 155a.

The through hole 155 is formed such that the width of the second hole 155b is greater than the thickness of the conductive tab 131 such that the conductive tab 131 may be inserted easily. The through hole 155 has a trapezoidal shape, and may prevent excess solder material from flowing down onto the PCM 150. Since the first hole 155a of the through hole 155 does not have additional space when the conductive tab 131 is inserted and soldered (153), the interference of excess solder with the function of the PCM 150 is prevented.

The conductive tab 131 is inserted into the through hole 155. The conductive tab 131 inserted into the through hole 155 is soldered (153) along with an upwardly protruding portion of the PCM 150 and the protective circuit (not shown) such that the battery cells 105 are electrically connected to the protective circuit (not shown).

Hereinafter, a battery pack according to some embodiments will be described in detail with reference to the FIG. 4.

Figure 4:
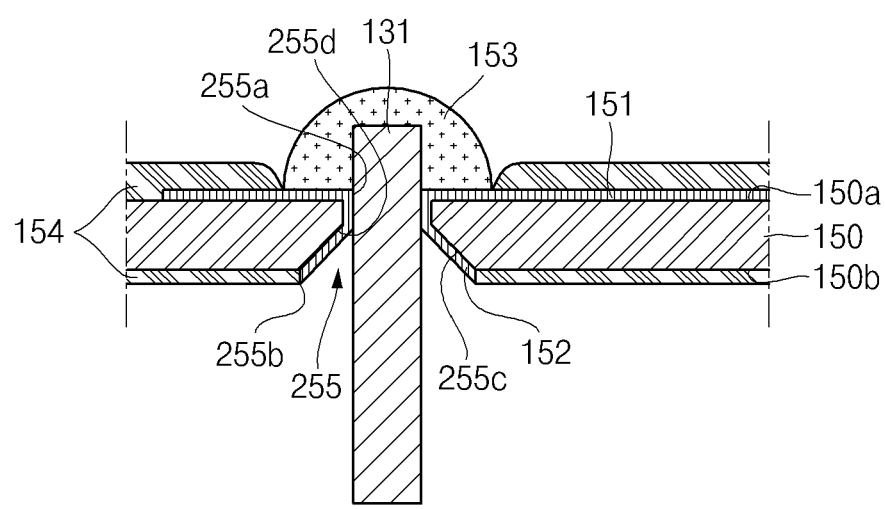
FIG. 4 is a sectional view illustrating a conductive tab of a battery pack according to some embodiments in a state when the conductive tab is inserted into and soldered to a through hole formed in a PCM.

FIG. 4 is a sectional view illustrating a conductive tab of a battery pack according to some embodiments in a state when the conductive tab is inserted into and soldered to a through hole formed in a PCM.

Compared with the PCM 150 of FIG. 3, a through hole 255 of the battery pack 100 of the embodiment illustrated in FIG. 4 has a different structure. Since the description of the foregoing embodiments except for the through hole 155 are similar to that illustrated in FIG. 4, a detailed description thereof will be omitted below for simplicity of the description.

The through hole 255 has a cone shape. Specifically, the through hole 255 includes a first hole 255a, a second hole 255b, an inclined surface 255c, and a third hole 255d. The first hole 255a is formed on the first surface 150a. The second hole 255b is formed on the second surface 150b and is wider than the first hole 255a. The inclined surface 255c is disposed between the second hole 255b and the third hole 255d. The third hole 255d is formed between the first hole 255a and the second hole 255b, and has the same width as the first hole 255a.

The through hole 255 is formed such that the width of the first hole 255a formed on the first surface 150a of the PCM 150 is equal to the thickness of the conductive tab 131. The through hole 255 is formed such that a thickness of a portion from the first hole 255a to the third hole 255d which is formed in a center portion of the PCM 150 is equal to the thickness of the conductive tab 131. Therefore, an area where the through hole 255 and the conductive tab 131 come into contact with each other widens, thereby improving stability of the connection. The through hole 255 is formed such that the second hole 255b formed on the second surface 150b of the PCM 150 is about two to about three times as wide as the first hole 255a. The through hole 255 is formed such that the width of the second hole 255b is greater than the thickness of the conductive tab 131 for the conductive tab 131 to be inserted easily. The through hole 255 has a cone shape, and may prevent the excess soldering material from flowing down onto the PCM 150 since the first hole 255a of the through hole 255 does not have excess space when the conductive tab 131 is inserted and soldered.

The conductive tab 131 is inserted into the through hole 255. The conductive tab 131 inserted into the through hole 255 is soldered with soldering material 153 along with the upwardly protruding portion of the PCM 150 and the protective circuit (not shown) such that the battery cells 105 are connected to the protective circuit (not shown).

The battery pack according to the above described embodiments may prevent the excess soldering material from flowing down onto the PCM when the conductive tab is inserted into and soldered to the hole formed in the PCM. As a result, interference with the functionality of the PCM by the soldering material is prevented.

According to some embodiments, a battery pack configured to prevent interference with the proper function of a PCM caused by excess soldering material (such as lead) from flowing down onto a protective circuit module PCM is disclosed.

According to some embodiments, a battery pack includes at least one battery cell, a PCM electrically connected to the battery cell, and a conductive tab configured to electrically connect the battery cell to the PCM. A tapered through hole is formed in the PCM such that the conductive tab is inserted into and fixed to the through hole.

The through hole may have a trapezoidal shape. The through hole may also have a cone shape. The PCM may include a first surface on which a conductive pattern is formed, and a second surface opposite to the first surface. The conductive tab may be soldered to the conductive pattern formed on the first surface of the PCM.

A plating layer connected to the conductive pattern may be formed on an inner wall of the through hole. The through hole may include a first hole formed on the first surface of the PCM, and a second hole formed on the second surface of the PCM.

According to some embodiments, the through hole may include a first hole formed on the first surface; a second hole formed on the second surface and wider than the first hole; and an inclined surface connecting the first hole to the second hole. A third hole having the same width as the first hole may be formed between the first hole and the second hole, and the inclined surface may be disposed between the second hole and the third hole. A width of the first hole may be equal to a thickness of the conductive tab. The second hole may be about two to about three times as wide as the first hole.

In addition, the conductive tab may be formed of a material selected from the group consisting of nickel (Ni), aluminum (Al), and copper (Cu).

Some embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present disclosure as set forth in the following claims.

What is claimed is:

1. A battery pack comprising:
at least one battery cell;
a protective circuit module (PCM) electrically connected to the at least one battery cell, the PCM comprising a first surface on which a conductive pattern is formed, and a second surface opposite to the first surface on which a protective layer is formed; and
a conductive tab electrically connecting the at least one battery cell to the PCM,
wherein the PCM has a tapered surface and said tapered surface of the PCM forms a tapered through hole,
wherein the tapered through hole comprises a first portion having a constant diameter, the first portion being proximate to the first surface of the PCM, and a second portion having a tapering diameter, the second portion being proximate to the second surface of the PCM: and
wherein the conductive tab is inserted into the tapered through hole and soldered to the conductive pattern formed on the first surface of the PCM.

2. The battery pack as claimed in claim 1, wherein the tapered through hole has a trapezoidal shape.

3. The battery pack as claimed in claim 1, wherein the tapered through hole has a cone shape.

4. The battery pack as claimed in claim 1, wherein a plating layer connected to the conductive pattern is formed on an inner wall of the tapered through hole.

5. The battery pack as claimed in claim 1, wherein the tapered through hole comprises a first hole formed on the first surface of the PCM, and a second hole formed on the second surface of the PCM.

6. The battery pack as claimed in claim 5, wherein a width of the first portion of the tapered through hole is equal to a thickness of the conductive tab.

7. The battery pack as claimed in claim 5, wherein the widest portion of the second portion of the tapered through hole is about two to about three times as wide as the first portion of the tapered through hole.

8. The battery pack as claimed in claim 1, wherein the conductive tab is formed of a material selected from the group consisting of nickel (Ni), aluminum (Al), and copper (Cu).

9. The battery pack as claimed in claim 1 wherein the thickness of the first portion is at least equal to the thickness of the conductive tab.

10. The battery pack as claimed in claim 1, wherein the conducting tab is soldered to the conducting pattern such that the second portion of the tapered through hole is free from solder.

* * * * *